United States Patent
Nam et al.

(10) Patent No.: US 12,040,799 B2
(45) Date of Patent: Jul. 16, 2024

(54) CLOCK GENERATOR AND ELECTRONIC DEVICE INCLUDING THE SAME

(71) Applicant: Samsung Electronics Co., Ltd., Suwon-si (KR)

(72) Inventors: Hyunseok Nam, Suwon-si (KR); Jaehyuk Yang, Suwon-si (KR); Yongsung Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/154,966

(22) Filed: Jan. 16, 2023

(65) Prior Publication Data
US 2023/0387889 A1 Nov. 30, 2023

(30) Foreign Application Priority Data

May 25, 2022 (KR) .................. 10-2022-0064200

(51) Int. Cl.
| | |
|---|---|
| *H03K 3/012* | (2006.01) |
| *G06F 1/06* | (2006.01) |
| *H03F 3/387* | (2006.01) |
| *H03H 11/04* | (2006.01) |
| *H03K 5/24* | (2006.01) |
| *H03K 5/00* | (2006.01) |

(52) U.S. Cl.
CPC ............... *H03K 3/012* (2013.01); *G06F 1/06* (2013.01); *H03F 3/387* (2013.01); *H03H 11/04* (2013.01); *H03K 5/24* (2013.01); *H03K 2005/00013* (2013.01)

(58) Field of Classification Search
CPC ...................................................... H03K 3/012
USPC .......................................................... 327/291
See application file for complete search history.

(56) References Cited

U.S. PATENT DOCUMENTS

| | | | |
|---|---|---|---|
| 6,405,330 B1 | 6/2002 | Hanf et al. | |
| 7,023,245 B2* | 4/2006 | Yuan ................. | G11C 27/024 |
| | | | 327/91 |
| 9,054,690 B2 | 6/2015 | Glibbery | |
| 9,143,314 B2* | 9/2015 | Yang .................. | H04L 7/033 |
| 9,473,074 B1 | 10/2016 | Blom | |
| 10,141,941 B2 | 11/2018 | Petrov | |

FOREIGN PATENT DOCUMENTS

KR  10-1998-0060708 A  8/1999

* cited by examiner

*Primary Examiner* — Tomi Skibinski
(74) *Attorney, Agent, or Firm* — Harness, Dickey & Pierce, P.L.C.

(57) ABSTRACT

A clock generating device includes a first voltage output circuit configured to output a first voltage corresponding to a power supply voltage in response to a preliminary clock signal, a clock output circuit configured to generate the preliminary clock signal and a final clock signal at a period corresponding to a difference between the first voltage and a negative feedback voltage, a negative feedback voltage generating circuit configured to generate the negative feedback voltage from a reference value corresponding to a frequency of the final clock signal and a second voltage and filtered to a uniform voltage level, and a second voltage output circuit configured to output the second voltage to the negative feedback voltage generating unit, the second voltage having lower sensitivity of fluctuations in the power supply voltage than the first voltage.

20 Claims, 16 Drawing Sheets

(a)

(b)

CLOCK GENERATOR AND ELECTRONIC DEVICE INCLUDING THE SAME

CROSS-REFERENCE TO RELATED APPLICATIONS

This application claims priority under 35 U.S.C. § 119 to Korean Patent Application No. 10-2022-0064200 filed on May 25, 2022, in the Korean Intellectual Property Office, the disclosures of which are incorporated by reference herein in their entireties.

BACKGROUND

Various example embodiments relate, in general, to a clock generator and/or an electronic device including the clock generator, and more particularly, to a clock generator with high accuracy and/or an electronic device including the clock generator.

An electronic device operates in synchronization with a clock. For this reason, it is necessary/desirable to generate an accurate clock for the stable operation of the electronic device. In particular, as an electronic device is highly integrated and operates at high speed, there is an increasing demand for generating a clock capable of guaranteeing or improving the reliability of operation and/or of implementing a low-power operation.

SUMMARY

Various example embodiments provide a clock generator with high accuracy and/or an electronic device including the clock generator.

Alternatively or additionally, various example embodiments provide a clock generator with high accuracy while operating at a low power and an electronic device including the clock generator.

According to various example embodiments, a clock generating device may include a first voltage output circuit configured to output a first voltage corresponding to a power supply voltage in response to a preliminary clock signal, a clock output circuit configured to generate the preliminary clock signal and a final clock signal, the generating of the preliminary clock signal and the final clock signal at a period corresponding to a difference between the first voltage and a negative feedback voltage, a negative feedback voltage generating circuit configured to generate the negative feedback voltage from a reference value corresponding to a frequency of the final clock signal and a second voltage, the reference value filtered to a uniform voltage level, and a second voltage output circuit configured to output the second voltage to the negative feedback voltage generating circuit, the second voltage having lower sensitivity of fluctuations in the power supply voltage than the first voltage.

According to various example embodiments, a clock generating device may include an internal voltage output circuit configured to output a first voltage and a second voltage in response to a preliminary clock signal, the first voltage and second voltage respectively correspond to a power supply voltage, a clock output circuit configured to generate the preliminary clock signal and a final clock signal, the preliminary clock signal and the final clock signal being generated at a period corresponding to a difference between the first voltage and a negative feedback voltage, and a negative feedback voltage generating circuit configured to generate the negative feedback voltage corresponding to the second voltage in response to the final clock signal. The negative feedback voltage generating circuit may include a switched capacitor circuit that is connected between an n-th node and a ground node configured to connect to ground voltage and is configured to apply a (2-2)-th voltage corresponding to the second voltage to the n-th node, a sample and hold circuit that is serially connected with the switched capacitor circuit at the n-th node and is configured to extract a reference value from the (2-2)-th voltage, and a first amplifier that is configured to receive the reference value and a (2-1)-th voltage through a first input terminal and a second input terminal respectively, to amplify a difference between the reference value and the (2-1)-th voltage, and to output the negative feedback voltage through an output terminal.

According to various example embodiments, an electronic device may include the clock generating device, and a power management integrated circuit configured to perform a power management operation in synchronization with the final clock signal received from the clock generating device.

BRIEF DESCRIPTION OF THE FIGURES

The above and other objects and/or features of example embodiments will become apparent by describing in detail embodiments thereof with reference to the accompanying drawings.

DETAILED DESCRIPTION

Below, various example embodiments will be described in detail and clearly to such an extent that an ordinary one in the art may or may easily implement example embodiments.

Figure 1:
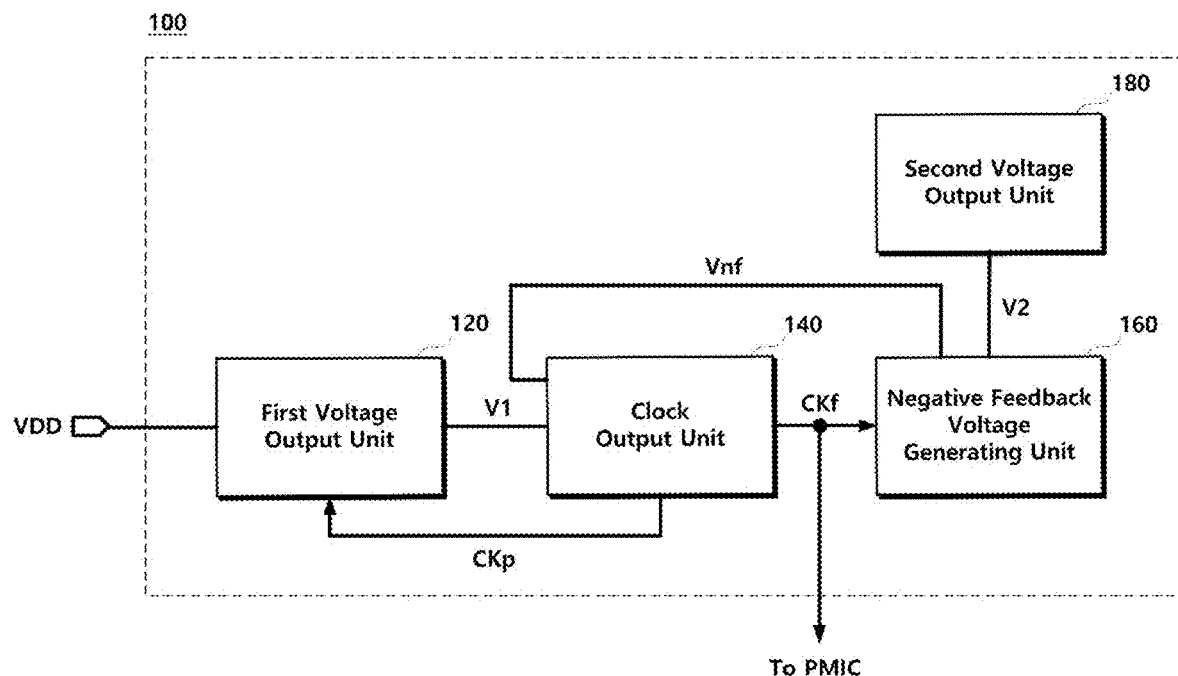
FIG. 1 is a diagram illustrating a clock generating device according to various example embodiments.

FIG. 1 is a diagram illustrating a clock generating device according to various example embodiments.

Referring to FIG. 1, a clock generating device 100 according to various example embodiments may generate a final clock signal CKf with high accuracy, even in a change of a power supply voltage VDD, by generating the final clock signal CKf by using a negative feedback voltage Vnf of a given magnitude. In this case, that the accuracy of the final clock signal CKf is high may mean that or may correspond to a period and/or a duty ratio of a clock is within an error range of a value designed with respect to the clock generating device 100.

The clock generating device 100 according to various example embodiments may include a first voltage output unit/circuit 120, a clock output unit/circuit 140, a negative feedback voltage generating unit/circuit 160, and a second voltage output unit/circuit 180.

The first voltage output unit 120 may output a first voltage V1 corresponding to the power supply voltage VDD in response to a preliminary clock signal CKp. The power supply voltage VDD may be or may correspond to a battery voltage and/or may be a rectified voltage. In some example embodiments, the power supply voltage VDD is a DC voltage. The preliminary clock signal CKp may be generated to have a short duty ratio compared to the final clock signal CKf. The duty ratio of the preliminary clock signal CKp may be set to correspond to the waveform and/or a period of the first voltage V1 as required. The first voltage V1 that is a voltage used to generate the final clock signal CKf together with the negative feedback voltage Vnf may be generated in the shape of a triangle wave; however, example embodiments are not necessarily limited thereto.

The clock output unit 140 may generate the preliminary clock signal CKp and the final clock signal CKf. The preliminary clock signal CKp and the final clock signal CKf may be generated to have a period corresponding to a difference between the first voltage V1 and the negative feedback voltage Vnf. The entirety of the clock output unit 140 according to various example embodiments may not include a crystal, e.g. may not include a quartz crystal, thus improving the degree of integration.

The clock output unit 140 may provide the preliminary clock signal CKp to the first voltage output unit 120; also, the clock output unit 140 may provide the final clock signal CKf to one or more other functional blocks (or intellectual property blocks and/or standard cells) of the clock generating device 100 such as the negative feedback voltage generating unit 160, and thus, the operation timing of the clock generating device 100 may be more easily controlled. Alternatively or additionally, the final clock signal CKf may be provided to the outside of the clock generating device 100, so as to be used to synchronize an operation of an electronic device such as a power management integrated circuit (PMIC). An example in which the final clock signal CKf is provided to the outside, for example, the power management integrated circuit is illustrated in FIG. 1, but example embodiments are not limited thereto. For example, the clock generating device 100 according to various example embodiments may be implemented in various electronic devices.

The negative feedback voltage generating unit 160 may generate the negative feedback voltage Vnf corresponding to a second voltage V2 in response to the final clock signal CKf. The second voltage V2 that is used to generate the negative feedback voltage Vnf may have low sensitivity to the fluctuations in the power supply voltage VDD, compared to the first voltage V1 that the first voltage output unit 120 outputs. The sensitivity to the fluctuations in the power supply voltage VDD may mean or correspond to a change (or fluctuation) rate of the power supply voltage VDD according to process, voltage, and temperature (PVT) variations. For example, in the case where the power supply voltage VDD originally set to 3 V changes to 3.1 V due to the PVT variations, the sensitivity of the power supply voltage VDD to the PVT change amount may be calculated to be 3.3%.

To generate the second voltage V2 that is lower than the first voltage V1 in sensitivity of the fluctuations in the power supply voltage VDD, stabilization processing may be further performed on the power supply voltage VDD one or more times, by the negative feedback voltage generating unit 160, and thus, the second voltage V2 may be generated.

The second voltage V2 may be supplied from the second voltage output unit 180, and the second voltage output unit 180 may perform the stabilization processing through internal logic, and/or the second voltage output unit 180 may receive a voltage experiencing the stabilization processing from the outside and may supply the second voltage V2. For example, the second voltage output unit 180 may receive the power supply voltage VDD from the outside of the clock generating device 100 and may generate the second voltage V2 through internal logic that alleviates the fluctuations in the power supply voltage VDD. Alternatively or additionally, the second voltage output unit 180 may receive a voltage, which is obtained by performing first stabilization processing on the power supply voltage VDD, from the outside of the clock generating device 100, and may output the second voltage V2 that is generated by performing an additional stabilization operation on the received voltage through the internal logic.

The clock generating device 100 according to various example embodiments may use the second voltage V2, in which the influence of the fluctuations in the power supply voltage VDD is reduced or minimized, for the purpose of generating the negative feedback voltage Vnf and thus may output the final clock signal CKf whose accuracy is high even in the change of the power supply voltage VDD.

Alternatively or additionally, as the negative feedback voltage Vnf is generated by using a reference value having a more uniform voltage level, the clock generating device 100 according to various example embodiments may reduce or minimize the fluctuations in the voltage level of the negative feedback voltage Vnf and thus may output the final clock signal CKf whose accuracy is high even in the change of the power supply voltage VDD. For example, the reference value may be generated by extracting a voltage value for the second voltage V2 as the uniform voltage level. The second voltage V2 is a voltage of an impedance corresponding to the final clock signal CKf.

Structures and operations of the first voltage output unit/circuit 120, the clock output unit/circuit 140, the negative feedback voltage generating unit/circuit 160, and the second voltage output unit/circuit 180 will be described in detail later.

The clock generating device 100 according to various example embodiments may use the second voltage V2 that is insensitive or less sensitive to the change of the power supply voltage VDD upon generating the negative feedback voltage Vnf, and the negative feedback voltage generating unit 160 may be implemented in a structure capable of generating the stable negative feedback voltage Vnf while decreasing the degree of integration. This will be described below.

Figure 2:
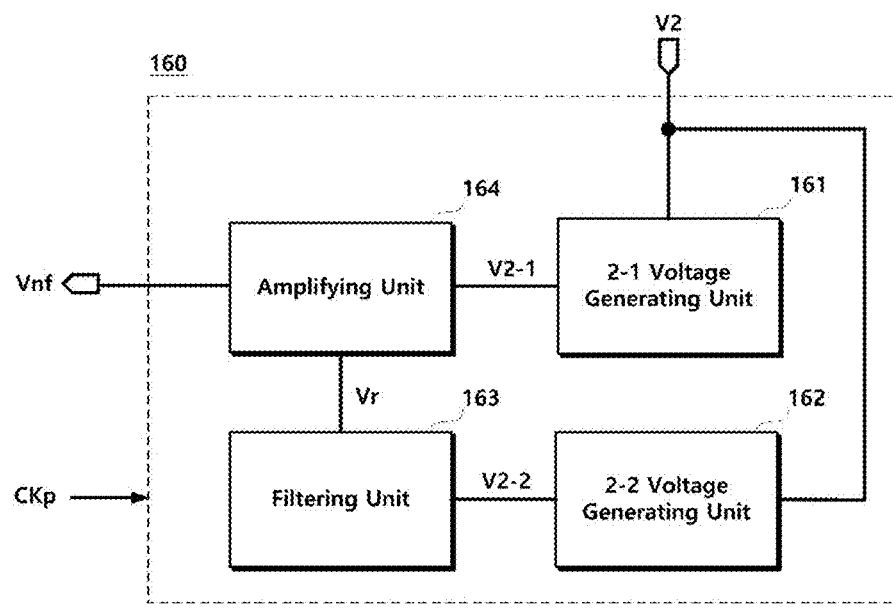
FIGS. 2 to 4 are diagrams illustrating examples of a negative feedback voltage generating unit according to various example embodiments.

FIG. 2 is a diagram illustrating a negative feedback voltage generating unit or circuit according to various example embodiments.

Referring to FIG. 2, the negative feedback voltage generating unit 160 according to various example embodiments may include a (2-1)-th voltage generating unit/circuit 161, a (2-2)-th voltage generating unit/circuit 162, a filtering unit/circuit 163, and an amplifying unit/circuit 164.

The (2-1)-th voltage generating unit 161 may generate a (2-1)-th voltage V2-1 based on a voltage value corresponding to the second voltage V2. For example, the (2-1)-th voltage V2-1 may be generated to have a voltage level that is determined based on a fixed resistor.

The (2-2)-th voltage generating unit 162 may generate a (2-2)-th voltage V2-2 based on the voltage value corresponding to the second voltage V2 in response to the final clock signal CKf. The (2-2)-th voltage V2-2 may be or may be based on a voltage associated with an impedance corresponding to a frequency of the final clock signal CKf. The (2-2)-th voltage V2-2 may have a value that is variable, e.g. may vary within a first range. For example, the (2-2)-th voltage V2-2 may be a voltage for an impedance that changes depending on the frequency of the final clock signal CKf.

The filtering unit 163 may filter the (2-2)-th voltage V2-2 to a reference value Vr of a uniform voltage level, and the amplifying unit 164 may amplify a difference between the (2-1)-th voltage V2-1 and the reference value Vr and may output the negative feedback voltage Vnf as an amplifying result.

The negative feedback voltage generating unit 160 according to various example embodiments may reduce or minimize the variations in the negative feedback voltage Vnf by extracting the reference value Vr through the filtering of the (2-2)-th voltage V2-2 and removing the fluctuations in the reference value Vr.

Figure 3:
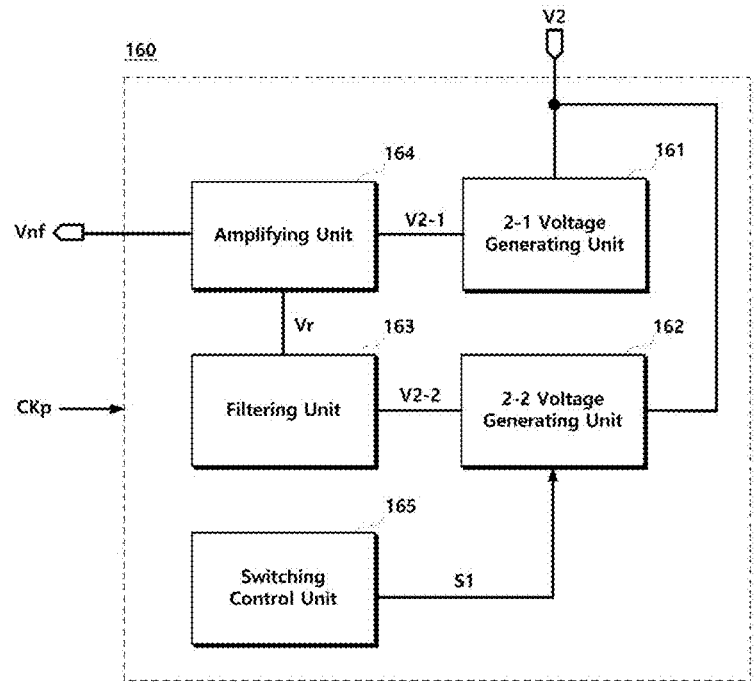

FIG. 3 is a diagram illustrating a negative feedback voltage generating unit according to various example embodiments.

The negative feedback voltage generating unit 160 of FIG. 3 may include the (2-1)-th voltage generating unit 161, the (2-2)-th voltage generating unit 162, the filtering unit 163, and the amplifying unit 164. In addition, the (2-2)-th voltage generating unit/circuit 162 of the negative feedback voltage generating unit 160 of FIG. 3 may be implemented to perform a frequency-impedance conversion operation by a switching operation like a switched capacitor circuit. In this case, the degree of integration and the stability of the (2-2)-th voltage generating unit 162 may be improved.

The negative feedback voltage generating unit 160 of FIG. 3 may further include a switching control unit/circuit 165 for the purpose of controlling the switching operation of the (2-2)-th voltage generating unit 162. The switching control unit 165 may generate a first switching signal S1 corresponding to the final clock signal CKf and may provide the first switching signal S1 to the (2-2)-th voltage generating unit 162. The first switching signal S1 may be generated to correspond to the number of switches that are used to perform the frequency-impedance conversion operation, and may be generated to have a period and/or a duty ratio corresponding to a control operation that is required in the frequency-impedance conversion operation.

Figure 4:
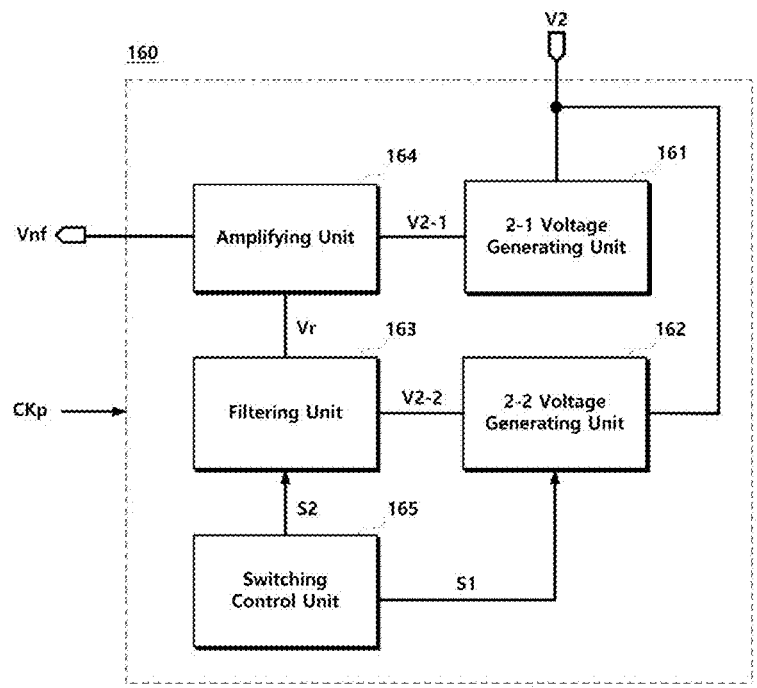

FIG. 4 is a diagram illustrating a negative feedback voltage generating unit according to various example embodiments.

As in the negative feedback voltage generating unit 160 of FIG. 3, the negative feedback voltage generating unit 160 of FIG. 4 may include the (2-1)-th voltage generating unit 161, the (2-2)-th voltage generating unit 162, the filtering unit 163, the amplifying unit 164, and the switching control unit 165. The (2-2)-th voltage generating unit 162 may be implemented to perform the frequency-impedance conversion operation by a switching operation like a switched capacitor circuit.

In addition, the filtering unit 163 of the negative feedback voltage generating unit 160 of FIG. 4 may be implemented to include a sample and hold circuit for the purpose of extracting the reference value Vr from the (2-2)-th voltage V2-2 through the switching operation. The sample and hold circuit may sample and hold the reference value Vr from the (2-2)-th voltage V2-2 through the control of the switching operation.

The switching control unit/circuit 165 may further generate a second switching signal S2 for the purpose of controlling the switching operation of the sample and hold circuit. In this case, the switching control unit 165 may generate the second switching signal S2 so as to be different from the transition timing of a corresponding switching signal belonging to the first switching signal S1. A stable operation may be performed by preventing or reducing the likelihood of and/or impact from a problem in which the (2-2)-th voltage V2-2 is rapidly changing, that may occur when the first switching signal S1 and the second switching signal S2 are simultaneously transition.

An example in which one switching control unit 165 generates both the first switching signal S1 and the second switching signal S2 is illustrated in FIG. 4, but example embodiments are not limited thereto. For example, the first switching signal S1 and the second switching signal S2 may be generated by separate switching control units.

Figure 5:
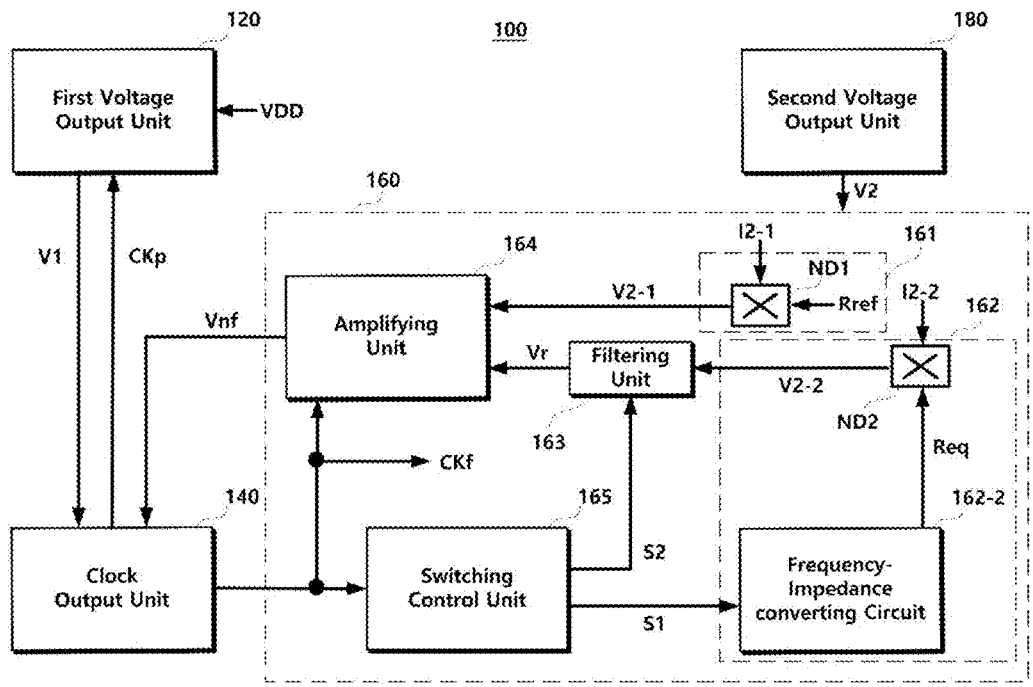
FIG. 5 is a diagram illustrating a clock generating device including a negative feedback voltage generating unit of FIG. 4.

FIG. 5 is a diagram illustrating a clock generating device including a negative feedback voltage generating unit of FIG. 4.

Referring to FIG. 5, the first voltage output unit 120 may output the first voltage V1 corresponding to the power supply voltage VDD in response to the preliminary clock signal CKp. The clock output unit/circuit 140 may generate the preliminary clock signal CKp and the final clock signal CKf that have a period corresponding to a difference between the first voltage V1 and the negative feedback voltage Vnf, may provide the preliminary clock signal CKp to the first voltage output unit 120, and may provide the final clock signal CKf to the negative feedback voltage generating unit 160.

The negative feedback voltage generating unit 160 may generate the negative feedback voltage Vnf corresponding to the second voltage V2 in response to the final clock signal CKf. To this end, the negative feedback voltage generating unit 160 may include the (2-1)-th voltage generating unit/circuit 161, the (2-2)-th voltage generating unit/circuit 162, the filtering unit/circuit 163, the amplifying unit/circuit 164, and the switching control unit 165. The (2-1)-th voltage generating unit 161 may generate the (2-1)-th voltage V2-1 based on a voltage value of a reference resistor Rref, and the (2-2)-th voltage generating unit 162 may generate the (2-2)-th voltage V2-2 based on a voltage value for an equivalent resistor Req of a frequency-impedance converting circuit 162-2. As described above, the frequency-impedance converting circuit 162-2 may be implemented to include a switched capacitor circuit.

In this case, the (2-1)-th voltage V2-1 and the (2-2)-th voltage V2-2 may be generated by applying a (2-1)-th current I2-1 and a (2-2)-th current I2-2 corresponding to the second voltage V2 to a first node ND1 connected with the reference resistor Rref and a second node ND2 connected with the equivalent resistor Req, respectively.

The filtering unit 163 may extract the reference value Vr from the (2-2)-th voltage V2-2. The amplifying unit 164 may amplify a difference between the (2-1)-th voltage V2-1 and the reference value Vr and may output the negative feedback voltage Vnf corresponding to an amplifying result. In this case, the switching control unit 165 may generate the first switching signal S1 and the second switching signal S2 for controlling the switching operations of the frequency-impedance converting circuit 162-2 and the filtering unit 163 in response to the final clock signal CKf.

The second voltage V2 may be supplied from the second voltage output unit 180.

Figure 6:
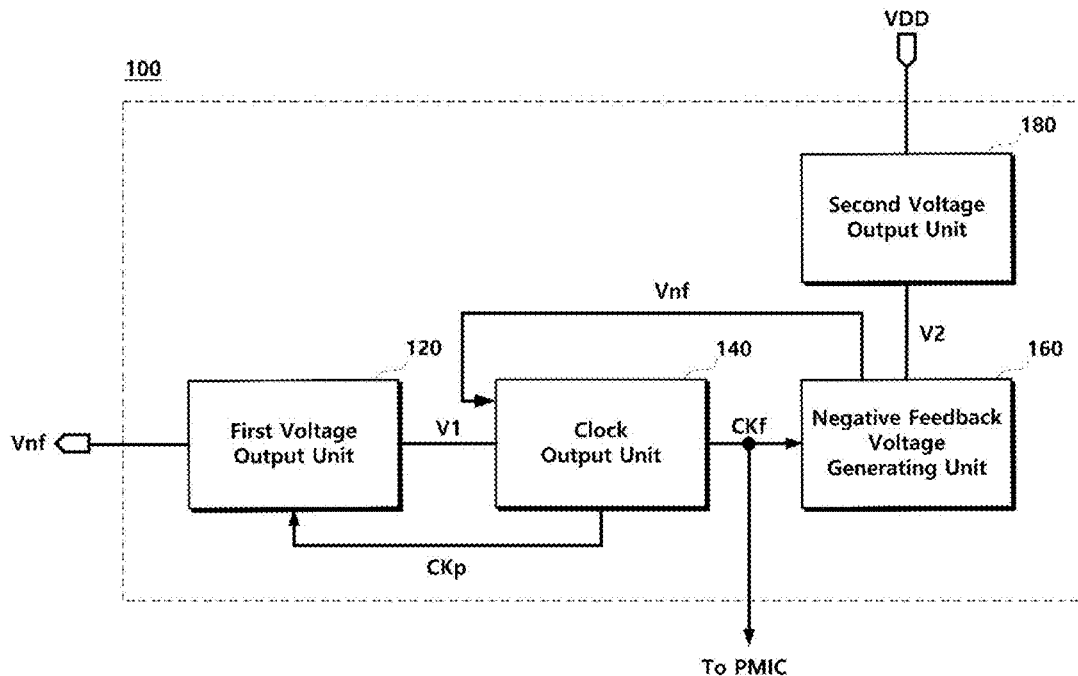
FIG. 6 is a diagram illustrating a clock generating device according to various example embodiments.

FIG. 6 is a diagram illustrating a clock generating device according to various example embodiments.

As in the clock generating device 100 of FIG. 1, to generate the final clock signal CKf with high accuracy even in the fluctuations in the power supply voltage VDD, the clock generating device 100 of FIG. 6 may include the first voltage output unit 120, the clock output unit 140, the negative feedback voltage generating unit 160, and the second voltage output unit 180.

In this case, the first voltage V1 and the second voltage V2 may be generated in a state where the power supply voltage VDD is applied to both the first voltage output unit 120, and the second voltage output unit 180. However, as described above, compared to the first voltage V1, the second voltage V2 may be generated such that the sensitivity of the fluctuations in the power supply voltage VDD is low. For example, compared to the first voltage V1, the second voltage V2 may be generated by further performing stabilization processing on the power supply voltage VDD once or more. To this end, the second voltage output unit 180 may include internal logic that alleviates the fluctuations in the power supply voltage VDD applied thereto.

Figure 7:
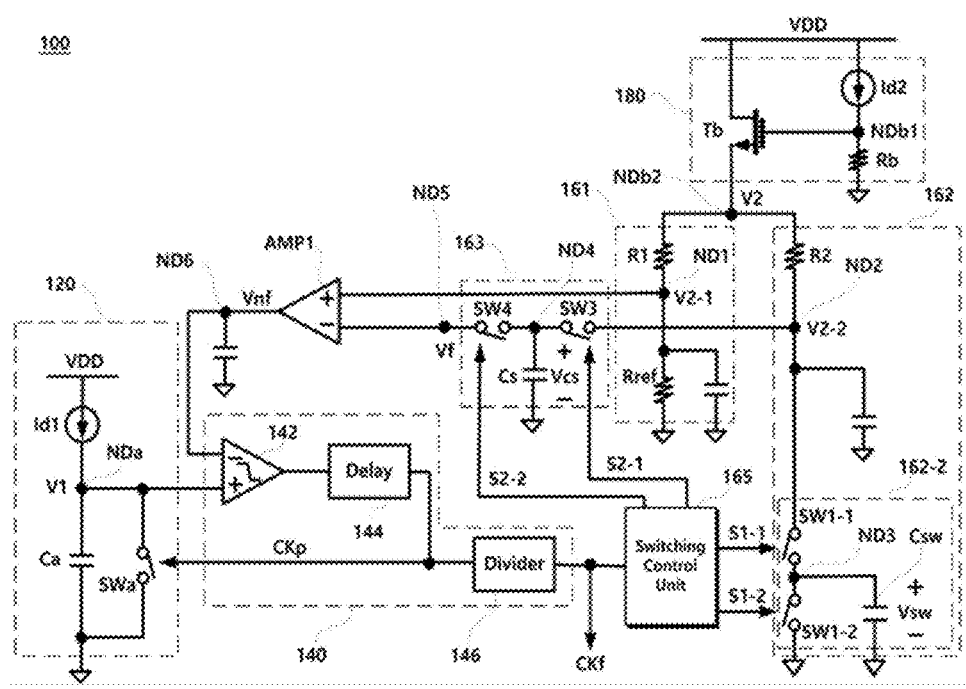
FIG. 7 is a diagram illustrating a circuit configuration of a clock generating device according to various example embodiments.

FIG. 7 is a diagram illustrating a circuit configuration of a clock generating device according to various example embodiments.

Referring to FIGS. 4, 6, and 7, to generate the final clock signal CKf with high accuracy even in the fluctuations in the power supply voltage VDD, the clock generating device 100 according to various example embodiments may include the first voltage output unit 120, the clock output unit 140, the negative feedback voltage generating unit 160, and the second voltage output unit 180.

The first voltage output unit 120 may include a capacitor Ca and a switch SWa connected in parallel between a first voltage node NDa connected with the power supply voltage VDD and a ground voltage. The switch SWa may be switched (or turned on or turned off) in response to the preliminary clock signal CKp. The switch SWa may be a transistor; however, example embodiments are not limited thereto. As the capacitor Ca is charged and discharged depending on the switching operation of the switch SWa, the first voltage V1 of a triangle waveform may be formed at the first voltage node NDa.

The second voltage output unit 180 may be provided separately from the first voltage output unit 120. The second voltage output unit 180 may include a transistor Tb that includes a gate connected to receive a voltage of a 21-th voltage node NDb1 connected with the power supply voltage VDD, a drain and a source connected between the power supply voltage VDD and a 22-th voltage node NDb2, and a resistor Rb placed between the 21-th voltage node NDb1 and the ground voltage.

A current that flows through the transistor Tb between the power supply voltage VDD and the 22-th voltage node NDb2 may be controlled by a voltage of the 21-th voltage node NDb1. In this case, the voltage of the 22-th voltage node NDb2 may be output as the second voltage V2. Accordingly, even though the voltage of the 21-th voltage node NDb1 changes due to the fluctuations in the power supply voltage VDD, the fluctuations in the second voltage V2 may be alleviated or at least partially alleviated.

The clock output unit 140 may include a comparator 142, a delay 144, and a divider 146.

The comparator 142 may compare the first voltage V1 and the negative feedback voltage Vnf and may output a comparison result. For example, the comparator 142 may output a first logical level (e.g., logic low) during a time period where the voltage level of the negative feedback voltage Vnf is greater than the first voltage V1.

The delay 144 may delay an output of the comparator 142 and may output the preliminary clock signal CKp as a delay result. In this case, the delay 144 may delay the output of the comparator 142 as much as an interval of pulses of the first voltage V1 required.

The divider 146 may divide the preliminary clock signal CKp and may output the final clock signal CKf as a division result. For example, the divider 146 may be implemented with a ½ divider (or one-half frequency divider) and may output the final clock signal CKf with the duty ratio of 0.5 based on the preliminary clock signal CKp with a short duty ratio. As described above, the negative feedback voltage generating unit 160 according to various example embodiments may operate based on the final clock signal CKf. In this case, compared to the case of using the preliminary clock signal CKp with the short duty ratio without modification, an abnormal switching operation may be prevented, and the negative feedback voltage Vnf may be stably generated.

The (2-1)-th voltage generating unit 161 of the negative feedback voltage generating unit 160 may include a first resistor R1 and the reference resistor Rref connected in series between the second voltage V2 and the ground voltage. The (2-2)-th voltage generating unit 162 may include a second resistor R2 and the frequency-impedance converting circuit 162-2 connected in series between the second voltage V2 and the ground voltage.

FIG. 7 shows an example in which the frequency-impedance converting circuit 162-2 is implemented with a switched capacitor circuit. The switched capacitor circuit may include a (1-1)-th switch SW1-1 and a (1-2)-th switch SW1-2 connected in series between the second node ND2 and the ground voltage, and a switched capacitor Csw connected in parallel with the (1-2)-th switch SW1-2.

FIG. 7 shows an example in which the filtering unit 163 is implemented with a sample and hold circuit. The sample and hold circuit may include a (2-1)-th switch SW3 and a (2-2)-th switch SW4 connected in series between the second node ND2 and a fifth node ND5, and a sampling capacitor Cs connected between a fourth node ND4 and the ground voltage.

The amplifying unit 164 of FIG. 5 may include a first amplifier AMP1.

For example, the negative feedback voltage generating unit 160 may include the first resistor R1 that is connected between the second voltage V2 and the first node ND1, the second resistor R2 that is connected between the second voltage V2 and the second node ND2, the reference resistor Rref that is connected between the first node ND1 and the ground voltage, the (1-1)-th switch SW1-1 that is turned on in response to a (1-1)-th switching signal S1-1 and is connected between the second voltage V2 and the third node ND3, the (1-2)-th switch SW1-2 that is turned on in response to a (1-2)-th switching signal S1-2 and is connected between the third node ND3 and the ground voltage, the switched capacitor Csw that is connected in parallel with the (1-2)-th switch SW1-2 between the third node ND3 and the ground voltage, the (2-1)-th switch SW3 that is connected between the second node ND2 and the fourth node ND4 and is turned on in response to a (2-1)-th switching signal S2-1, the (2-2)-th switch SW4 that is connected between the fourth node ND4 and the fifth node ND5 and is turned on in response to a (2-2)-th switching signal S2-2, the sampling capacitor Cs that is connected between the fourth node ND4 and the ground voltage, and the first amplifier AMP1 that includes a first input terminal receiving a voltage value (i.e., the (2-1)-th voltage V2-1) of the first node ND1, a second input terminal receiving a voltage value Vcs of the fourth node ND4, and an output terminal outputting the negative feedback voltage Vnf.

The second resistor R2 may have the same resistance value as the first resistor R1. In the circuit structure illustrated in FIG. 7, when the first resistor R1 and the second resistor R2 have the same resistance value, the reference resistor Rref may be identical in resistance value to the equivalent resistor Req. In this case, the resistance value of the equivalent resistor Req may be a reciprocal of the product of the final clock signal CKf and the capacitance of the switched capacitor Csw.

The first resistor R1 and the reference resistor Rref may be connected in series between the second voltage V2 and the ground voltage, both one end of the first resistor R1 and one end of the reference resistor Rref may be connected with the first node ND1, one of the first resistor R1 and the reference resistor Rref may have a positive temperature coefficient, and the other thereof may have a negative temperature coefficient. According to this configuration, even though a temperature (e.g. an ambient temperature) changes, the (2-1)-th voltage V2-1 may be uniformly or more uniformly generated.

Figure 8:
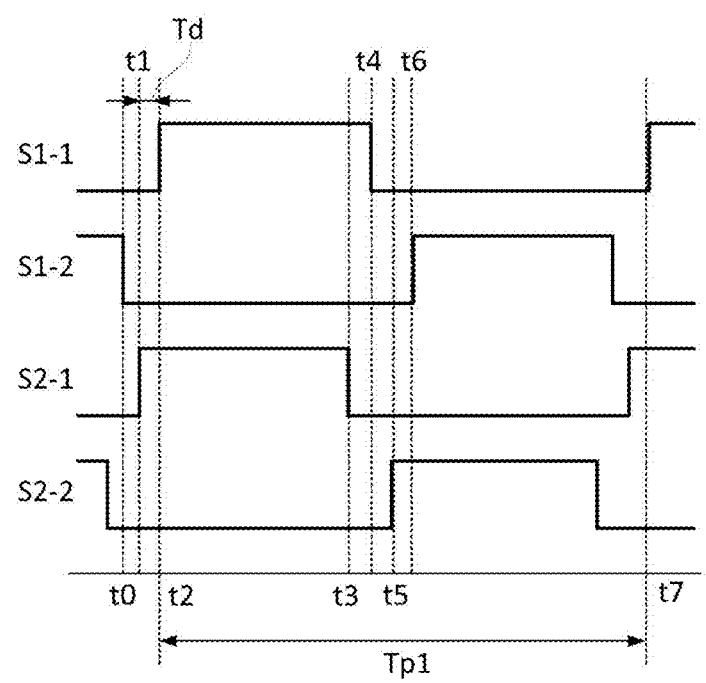
FIG. 8 is a diagram illustrating switching signals according to various example embodiments.

FIG. 8 is a diagram illustrating switching signals according to various example embodiments.

Referring to FIGS. 7 and 8, in response to the final clock signal CKf, the switching control unit 165 may generate the (1-1)-th switching signal S1-1, the (1-2)-th switching signal S1-2, the (2-1)-th switching signal S2-1, and the (2-2)-th switching signal S2-2 that have different transition timings and have the same period. The (1-1)-th switching signal S1-1, the (1-2)-th switching signal S1-2, the (2-1)-th switching signal S2-1, and the (2-2)-th switching signal S2-2 may respectively control the switching operations of the (1-1)-th switch SW1-1, the (1-2)-th switch SW1-2, the (2-1)-th switch SW3, and the (2-2)-th switch SW4.

The switching signal S1-1 may be generated, for example, in synchronization with the final clock signal CKf so as to transition to logic high at time point t2 of a first period Tp1 and transition to logic low at time point t4. A next period may be repeated from time point t7.

The switching signal S1-2 may be generated to be different from an enable period of the (1-1)-th switching signal S1-1. For example, when the (1-1)-th switching signal S1-1 is at logic low, the (1-2)-th switching signal S1-2 may be at logic high; when the (1-1)-th switching signal S1-1 is at logic high, the (1-2)-th switching signal S1-2 may be at logic low. Alternatively or additionally, the switching control unit 165 may generate the (1-1)-th switching signal S1-1 and the (1-2)-th switching signal S1-2 such that there is a time period t4 to t6 where both the (1-1)-th switching signal S1-1 and the (1-2)-th switching signal S1-2 are at logic low. For example, in a time period from t0 to t2 and a time period from t4 to t6, both the (1-1)-th switching signal S1-1 and the (1-2)-th switching signal S1-2 may have a logical level corresponding to logic low.

The (2-1)-th switching signal S2-1 may be generated to transition with a difference of a first time Td with the (1-1)-th switching signal S1-1. The first time Td may be set to be shorter than the time period t4 to t6 where both the (1-1)-th switching signal S1-1 and the (1-2)-th switching signal S1-2 are at logic low. Accordingly, after the (2-1)-th switch SW3 is turned off, the (1-1)-th switch SW1-1 may be turned off. For example, the voltage Vsw of the switched capacitor Csw may be charged in the sampling capacitor Cs through the second node ND2, with both the (1-1)-th switch SW1-1 and the (2-1)-th switch SW3 enabled. As the (1-1)-th switch SW1-1 and the (2-1)-th switch SW3 are simultaneously turned on or turned off, the voltage of the second node ND2, for example, the (2-2)-th voltage V2-2 may be prevented from sharply changing. A length of the first time Td may be differently set depending on a magnitude of the (2-2)-th voltage V2-2, a characteristic of each circuit element, etc.

The (2-2)-th switching signal S2-2 may be generated to be different from an enable period of the (2-1)-th switching signal S2-1. For example, when the (2-1)-th switching signal S2-1 is at logic low, the (2-2)-th switching signal S2-2 may be at logic high; when the (2-1)-th switching signal S2-1 is at logic high, the (2-2)-th switching signal S2-2 may be at logic low. Also, the switching control unit 165 may generate the (2-1)-th switching signal S2-1 and the (2-2)-th switching signal S2-2 such that there is a time period t3 to t5 where both the (2-1)-th switching signal S2-1 and the (2-2)-th switching signal S2-2 are at logic low.

An example where switching signals are generated to have different transition timings is described above. However, in the case where there are two or more switches performing the same operation, switching signals associated with the switches performing the same operation may be generated to have the same transition timing.

Figure 9:
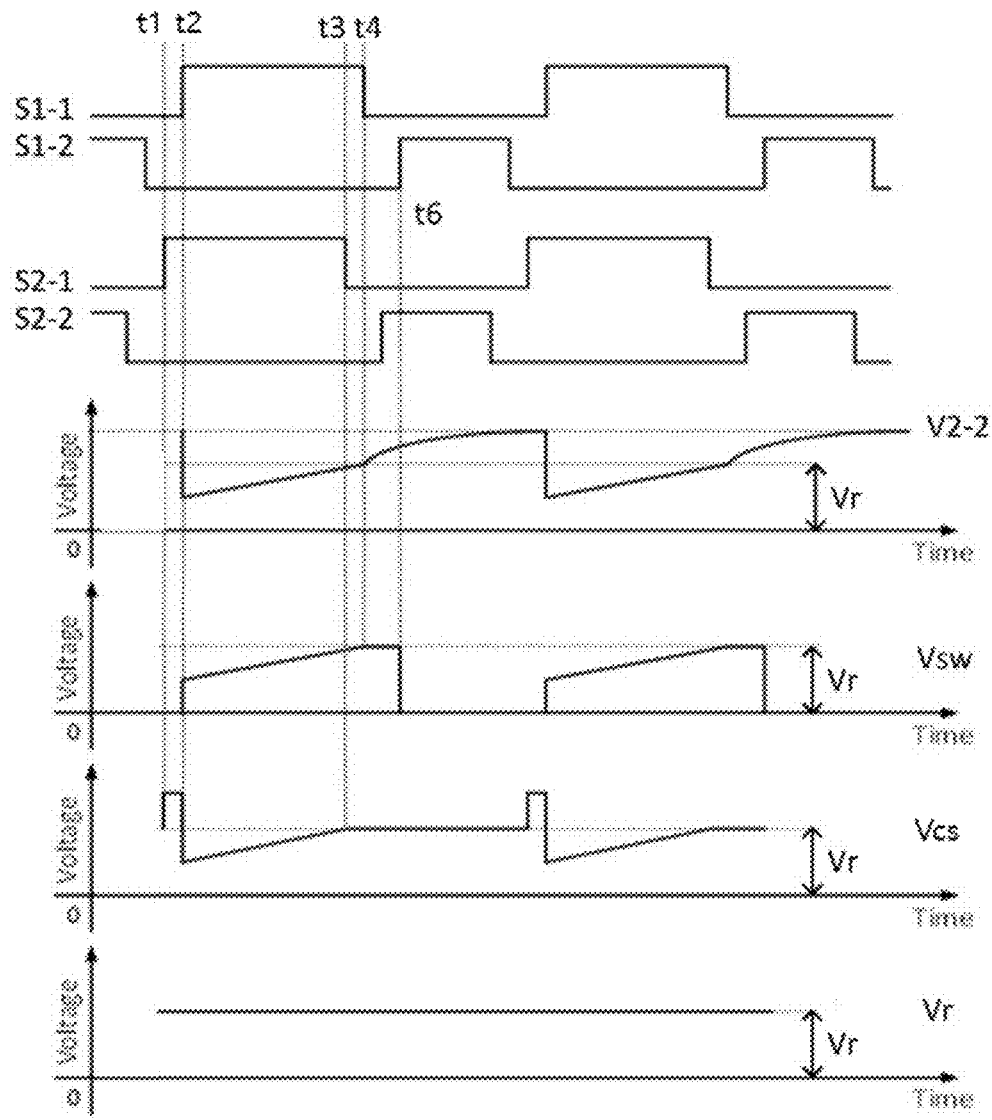
FIG. 9 is a diagram for describing an operation of generating a negative feedback voltage, according to various example embodiments.

FIG. 9 is a diagram for describing an operation of generating a negative feedback voltage, according to various example embodiments.

Referring to FIGS. 7 to 9, at time point t1, as the (2-1)-th switching signal S2-1 transitions from logic low to logic high, the (2-1)-th switch SW3 of the sample and hold circuit may be turned on, and the second node ND2 and the fourth node ND4 may be connected. At time point t2 at which the first time Td passes from time point t1, the (1-1)-th switching signal S1-1 may transition from logic low to logic high. As the (1-1)-th switch SW1-1 of the switched capacitor circuit is turned on by the (1-1)-th switching signal S1-1, the second node ND2 and the third node ND3 may be connected, and thus, the third node ND3 and the fourth node ND4 may be connected.

Accordingly, in the enable period t2 to t3 of the (1-1)-th switching signal S1-1 and the (2-1)-th switching signal S2-1, the voltage Vsw of the third node ND3 and the voltage Vcs of the fourth node ND4, for example, a voltage of the switched capacitor Csw and a voltage of the sampling capacitor Cs may increase. Also, a voltage of the second node ND2 between the third node ND3 and the fourth node ND4, for example, the (2-2)-th voltage V2-2 may increase.

At time point t3, as the (2-1)-th switching signal S2-1 transitions from logic high to logic low, the voltage Vcs of the fourth node ND4 may be maintained at the reference value Vr.

Likewise, at time point t4, as the (1-1)-th switching signal S1-1 transitions from logic high to logic low, the voltage Vsw of the third node ND3 may be maintained at the reference value Vr, and may then decrease to the ground voltage at time point t6 at which the (1-2)-th switching signal S1-2 transitions from logic low to logic high. The reason may be that as the (1-2)-th switching signal S1-2 transitions from logic low to logic high, the (1-2)-th switch SW1-2 of the switched capacitor circuit is turned on and thus the third node ND3 is connected with the ground voltage.

In a time period from t3 to t4, because the second node ND2 and the third node ND3 are connected, the voltage of the second node ND2, that is, the (2-2)-th voltage V2-2 may increase to the reference value Vr together with the voltage Vsw of the third node ND3. Next, from time point t4 at which the (1-1)-th switching signal S1-1 transitions from logic high to logic low to time point t6 at which the (1-2)-th switching signal S1-2 transitions from logic low to logic high, the voltage Vsw of the third node ND3 may be maintained at the reference value Vr, and the (2-2)-th voltage V2-2 being the voltage of the second node ND2 may smoothly increase and then may be maintained at the corresponding voltage level until time point t7 at which a next period of the first period Tp1 starts. At time point t7, the (1-1)-th switch SW1-1 may again be turned on, and charges of the second node ND2 may be momently transferred to the switched capacitor Csw. As such, the (2-2)-th voltage V2-2 being the voltage of the second node ND2 may decrease to a given voltage level and then may again increase together with the voltage Vsw of the third node ND3.

As described above, the voltage Vcs of the fourth node ND4 may be maintained at the reference value Vr after time point t3 at which the (2-1)-th switching signal S2-1 transitions to logic low. As the (2-2)-th switch SW4 is turned on in a state where the voltage Vcs of the fourth node ND4 is set to the reference value Vr, the reference value Vr may be applied to the fifth node ND5. For example, as the (2-2)-th switching signal S2-2 transitions to logic high, the (2-2)-th switch SW4 may be turned on, and thus, the fourth node ND4 and the fifth node ND5 may be connected.

The voltage of the fifth node ND5, for example, the reference value Vr may be input to the input terminal of the first amplifier AMP1. Because both the reference value Vr and the (2-1)-th voltage V2-1 applied to the input terminals of the first amplifier AMP1 are uniform even in the fluctuations in the power supply voltage VDD, the negative feedback voltage Vnf corresponding to a difference between the (2-1)-th voltage V2-1 and the reference value Vr may also be generated uniformly. In this case, the reference value Vr may be generated to correspond to the voltage level of the (2-1)-th voltage V2-1.

Accordingly, the final clock signal CKf generated by using the negative feedback voltage Vnf may also have high accuracy even in the change of the power supply voltage VDD.

Figure 10:
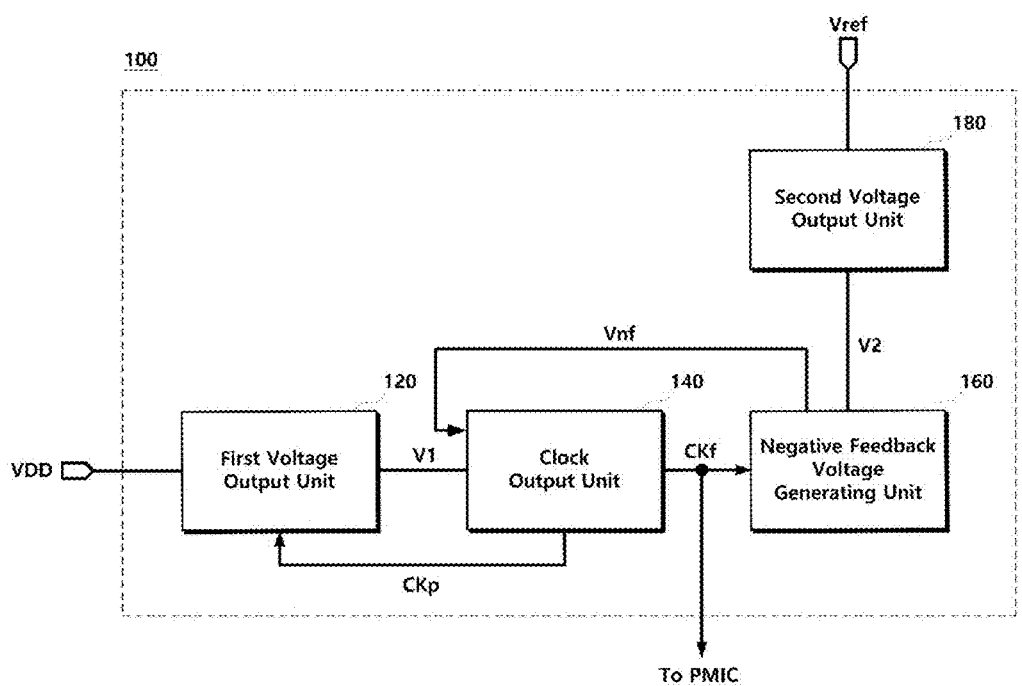
FIG. 10 is a diagram illustrating a clock generating device according to various example embodiments.

FIG. 10 is a diagram illustrating a clock generating device according to various example embodiments.

As in the clock generating device 100 of FIG. 1, to generate the final clock signal CKf with high accuracy even in the fluctuations in the power supply voltage VDD, the clock generating device 100 of FIG. 10 may include the first voltage output unit 120, the clock output unit 140, the negative feedback voltage generating unit 160, and the second voltage output unit 180.

In this case, the first voltage V1 corresponding to the power supply voltage VDD is generated as the power supply voltage VDD from the outside is applied to the first voltage output unit 120, whereas not the power supply voltage VDD but a reference voltage Vref may be applied to the second voltage output unit 180 from the outside. The reference voltage Vref may be a voltage experiencing stabilization processing with regard to the fluctuations in the power supply voltage VDD. For example, the reference voltage Vref may be generated by a bandgap circuit (not illustrated) placed outside the clock generating device 100. The bandgap circuit may generate the reference voltage Vref whose value is uniform even though the power supply voltage VDD is variable due to a temperature change or the like.

As the reference voltage Vref smaller than the power supply voltage VDD is applied to the clock generating device 100, the clock generating device 100 may operate at a low power.

The second voltage output unit 180 may include internal logic that additionally performs a stabilization operation on the reference voltage Vref and thus may generate the second voltage V2 such that the sensitivity of the fluctuations in the power supply voltage VDD further decreases.

Figure 11:
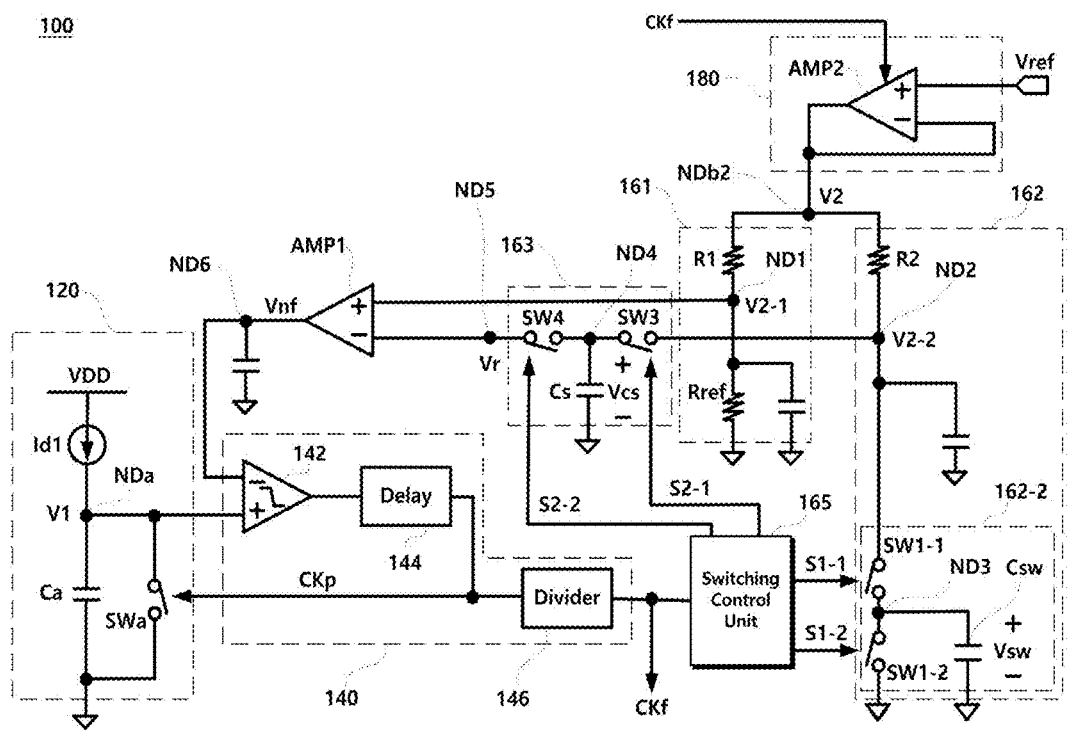
FIG. 11 is a diagram illustrating a circuit configuration of a clock generating device according to various example embodiments.

FIG. 11 is a diagram illustrating a circuit configuration of a clock generating device according to various example embodiments.

Referring to FIGS. 4, 6, and 11, to generate the final clock signal CKf with high accuracy even in the fluctuations in the power supply voltage VDD, the clock generating device 100 according to various example embodiments may include the first voltage output unit 120, the clock output unit 140, the negative feedback voltage generating unit 160, and the second voltage output unit 180.

Configurations and/or operations of the first voltage output unit 120, the clock output unit 140, and the negative feedback voltage generating unit 160 of FIG. 11 may be the same as the configurations described with reference to FIG. 7 and the operations described with reference to FIG. 9. However, unlike FIG. 7, the second voltage output unit 180 may be implemented with a second amplifier AMP2 that includes a first input terminal receiving the reference voltage Vref, an output terminal outputting the second voltage V2, and a second input terminal again receiving the second voltage V2 output from the output terminal. Accordingly, as the compensation for the fluctuations in the reference voltage Vref is continuously made, the second voltage V2 may be stably generated.

Figure 12:
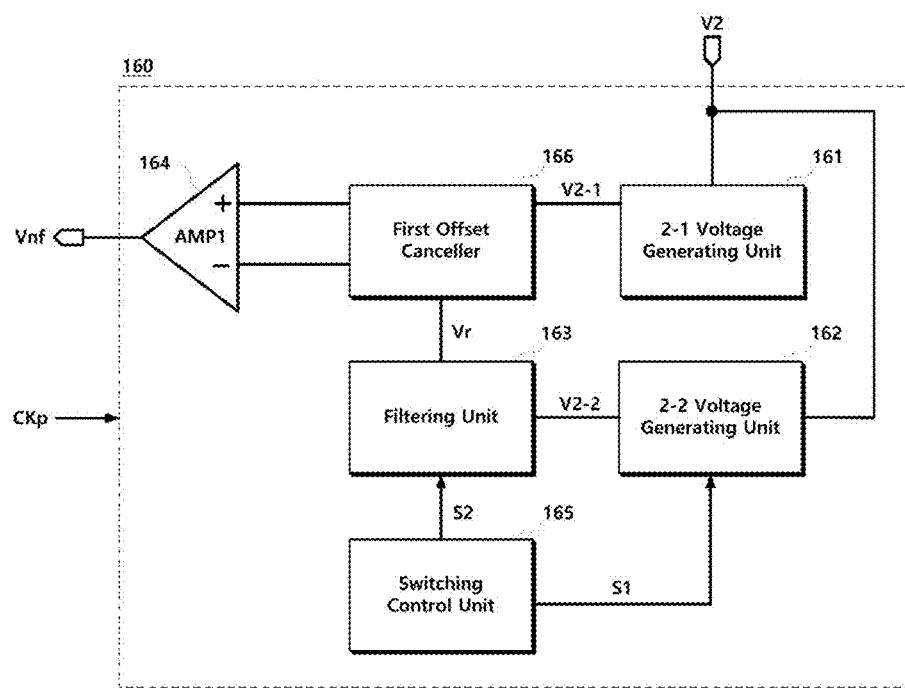
FIG. 12 is a diagram illustrating a negative feedback voltage generating unit according to various example embodiments.

FIG. 12 is a diagram illustrating a negative feedback voltage generating unit according to various example embodiments.

As in the negative feedback voltage generating unit 160 of FIG. 4, the negative feedback voltage generating unit 160 of FIG. 12 may include the (2-1)-th voltage generating unit 161, the (2-2)-th voltage generating unit 162, the filtering unit 163, the amplifying unit 164, and the switching control unit 165. Also, in the negative feedback voltage generating unit 160 of FIG. 12, the frequency-impedance converting circuit 162-2 of the (2-2)-th voltage generating unit 162 may include the switched capacitor circuit, and the filtering unit 163 may include the sample and hold circuit.

In addition, the amplifying unit 164 of the negative feedback voltage generating unit 160 of FIG. 12 may include the first amplifier AMP1 that receives the (2-1)-th voltage V2-1 and the reference value Vr as inputs and outputs the negative feedback voltage Vnf.

Also, the negative feedback voltage generating unit 160 of FIG. 12 may further include a first offset canceller 166 that cancels an offset of the first amplifier AMP1. For example, the first offset canceller 166 may include a chopper circuit. The chopper circuit may cancel the offset of the first amplifier AMP1 by performing modulation and demodulation operations through a switching operation that is repeatedly turned on and turned off in response to the final clock signal CKf.

The negative feedback voltage generating unit 160 according to various example embodiments may include the first offset canceller 166 and thus may generate the negative feedback voltage Vnf uniformly even though an offset is present in the first amplifier AMP1. The first offset canceller 166 may be applied to the negative feedback voltage generating unit 160 of FIGS. 2 to 4.

Figure 13:
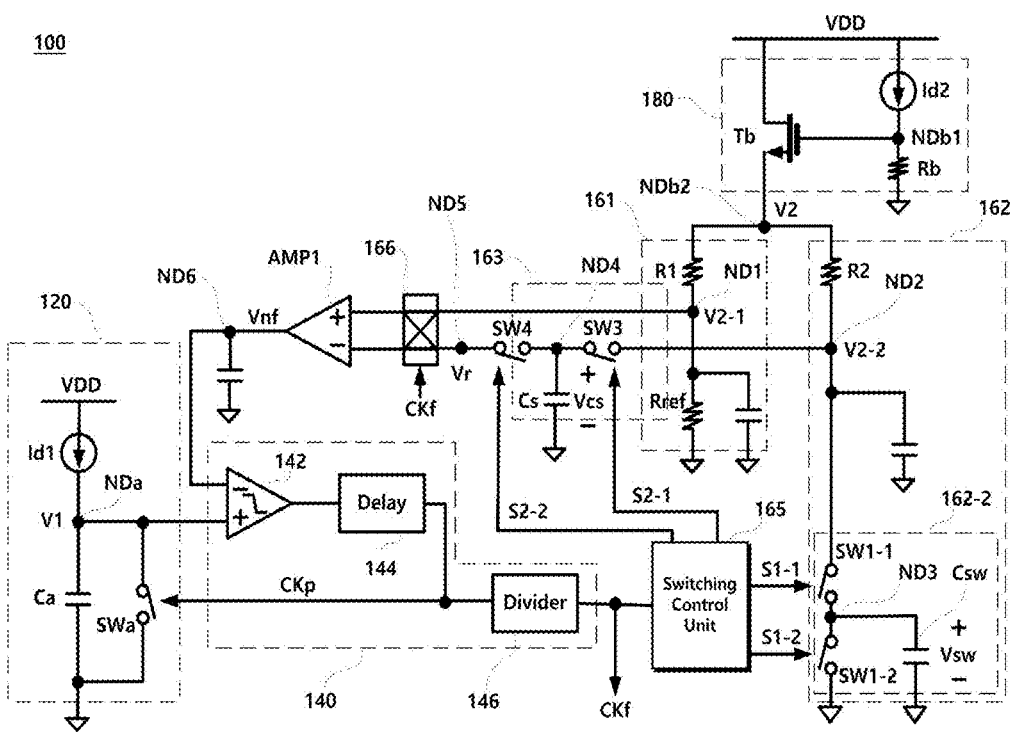
FIGS. 13 and 14 are diagrams illustrating circuit configurations of a clock generating device according to various example embodiments.
Figure 14:
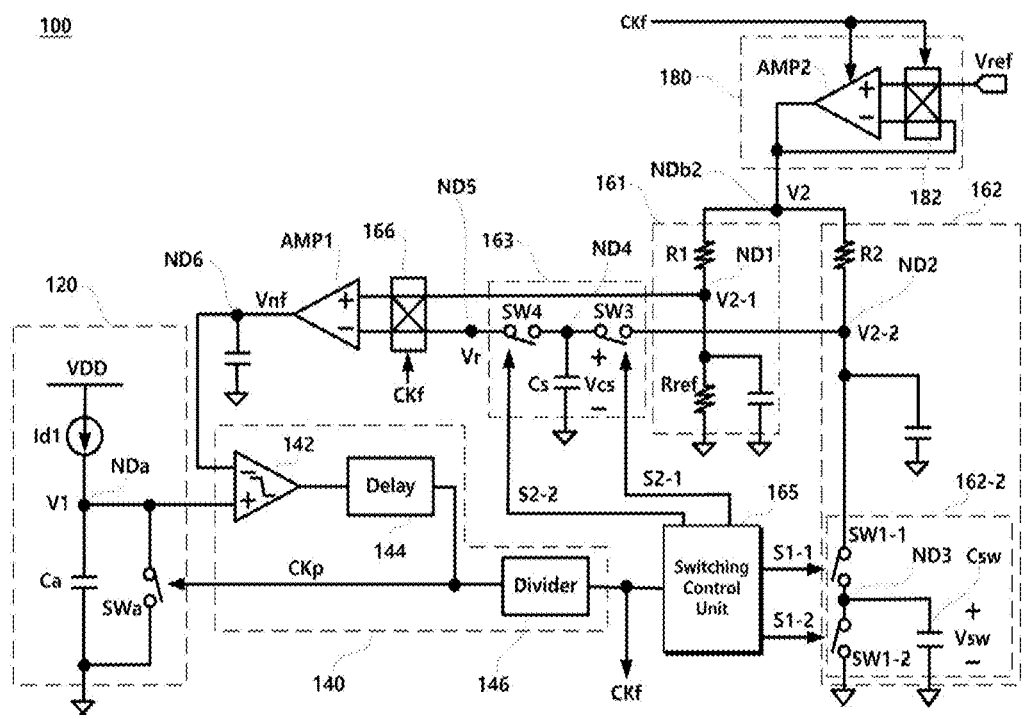

FIGS. 13 and 14 are diagrams illustrating circuit configurations of a clock generating device according to various example embodiments.

Referring to FIG. 13, compared to the clock generating device 100 of FIG. 7, the clock generating device 100 of FIG. 13 may further include the first offset canceller 166 between the input terminals of the first amplifier AMP1 and the first and fifth nodes ND1 and ND5. Accordingly, the first amplifier AMP1 may generate the negative feedback voltage Vnf being uniform without the influence of the offset.

Referring to FIG. 14, compared to the clock generating device 100 of FIG. 11, the clock generating device 100 of FIG. 14 may further include the first offset canceller 166 between the input terminals of the first amplifier AMP1 and the first and fifth nodes ND1 and ND5. In addition, the clock generating device 100 of FIG. 14, that is, the second voltage output unit 180 may further include a second offset canceller 182. The second offset canceller 182 may cancel an offset of the second amplifier AMP2. Accordingly, the second amplifier AMP2 may generate the second voltage V2 being uniform without the influence of the offset.

Figure 15:
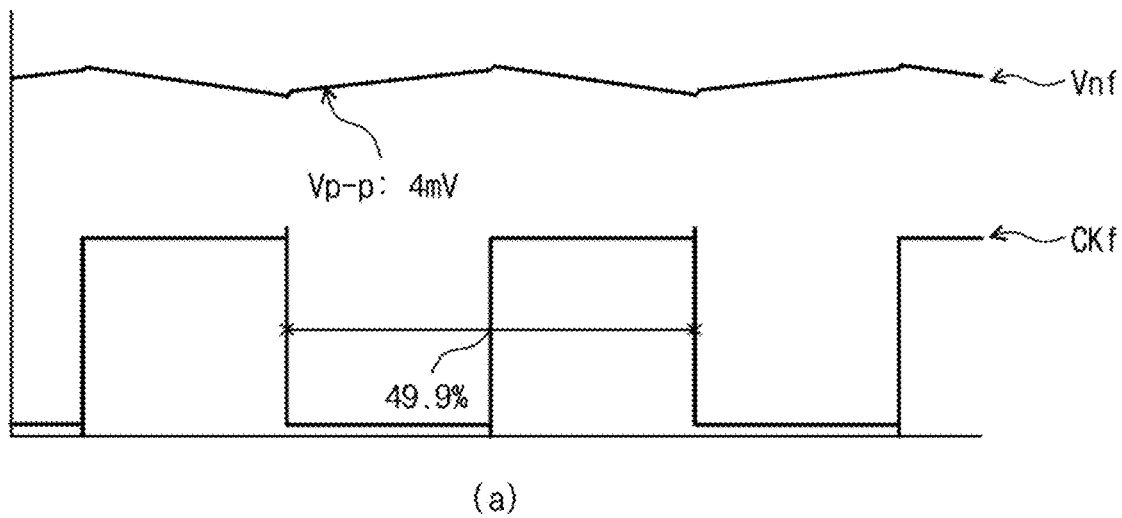
FIG. 15 is a diagram illustrating an operating result of a clock generating device according to various example embodiments.
Figure 15:
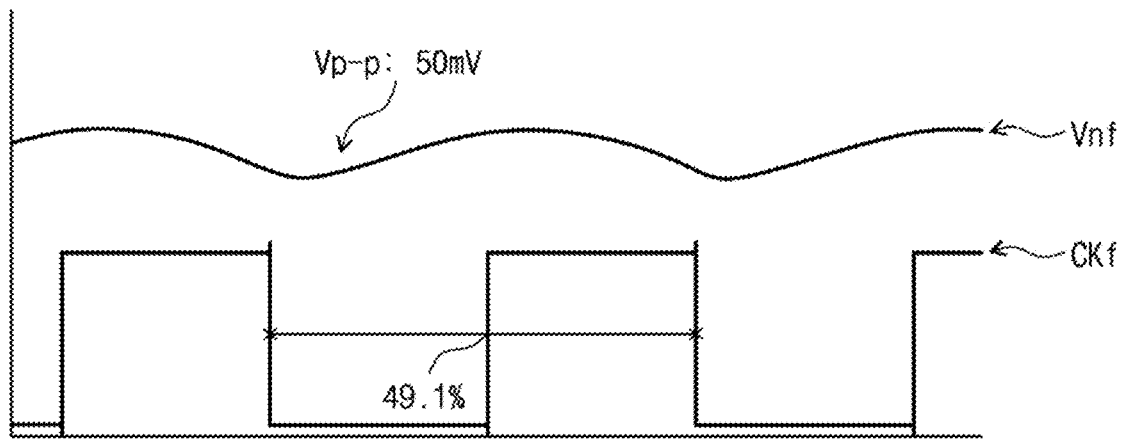

FIG. 15 is a diagram illustrating an operating result of a clock generating device according to various example embodiments.

Referring to FIGS. 2 and 15, from the clock generating device 100 according to various example embodiments, it is confirmed that because the reference value Vr applied to the amplifying unit 164 is uniform and a difference with the (2-1)-th voltage V2-1 is small, an output of the amplifying unit 164, that is, the negative feedback voltage Vnf has a voltage level between about 0.07 V and about 0.074 V and a peak-to-peak amplitude Vp-p is equal to or less than about 4 mV. The above operating result is obtained by performing Monte Carlo simulation on the clock generating device 100, which is implemented to have the circuit configuration of FIG. 13 or 14, based on a frequency of 32.768 kHz. It is confirmed from the simulation result that there is accurately generated the final clock signal CKf whose duty ratio is about 49.9%.

Figure 16:
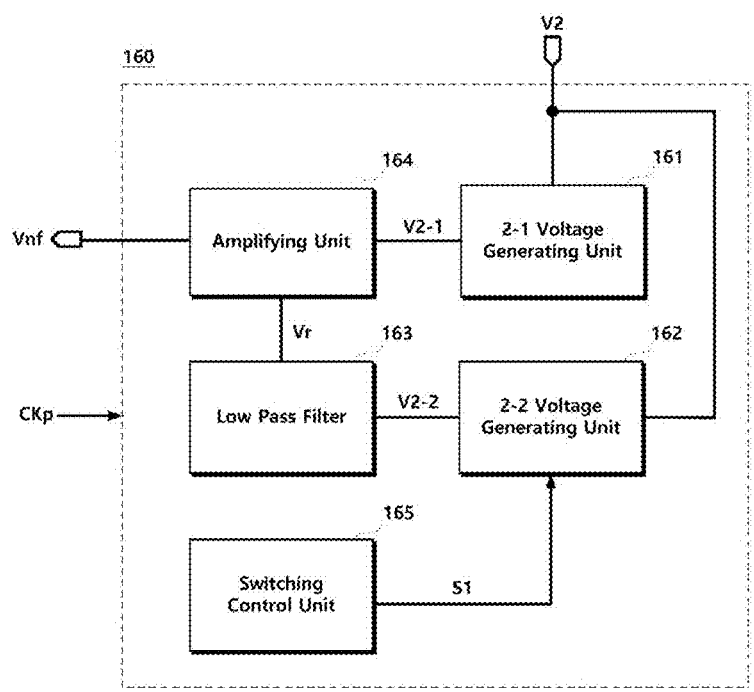
FIG. 16 is a diagram illustrating a negative feedback voltage generating unit according to various example embodiments.
Figure 17:
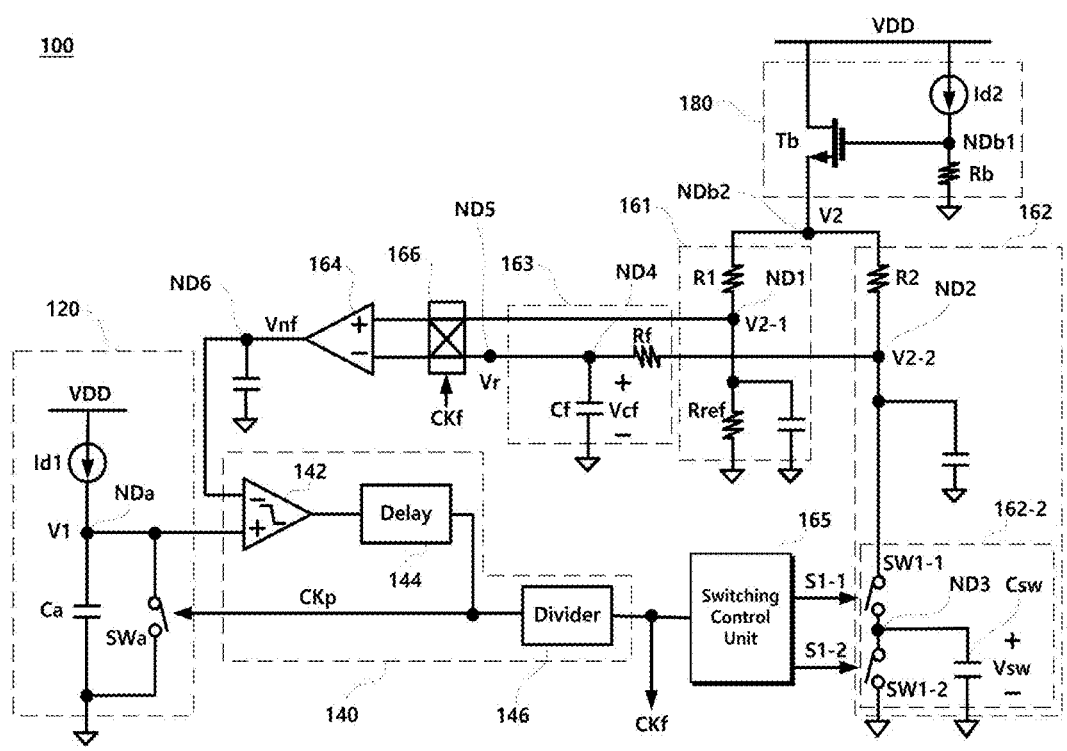
FIG. 17 is a diagram illustrating a circuit configuration of a clock generating device according to various example embodiments.

FIG. 16 is a diagram illustrating a negative feedback voltage generating unit according to various example embodiments, and FIG. 17 is a diagram illustrating a circuit configuration of a clock generating device according to various example embodiments.

Referring to FIG. 16, like the negative feedback voltage generating unit 160 of FIG. 3, the negative feedback voltage generating unit 160 of FIG. 16 may include the (2-1)-th voltage generating unit 161, the (2-2)-th voltage generating unit 162, the filtering unit 163, the amplifying unit 164, and the switching control unit 165. The filtering unit 163 of FIG. 16 may be implemented to include a low pass filter (LPF).

Referring to FIG. 17, the filtering unit 163 of the clock generating device 100 of FIG. 17 may be implemented with a low pass filter that includes a filter resistor RF placed between the second node ND2 and the fourth node ND4, and a filter capacitor Cf placed between the fourth node ND4 and the ground voltage. In this case, a resistance value of the filter resistor RF and a capacitance value of the filter capacitor Cf may be set such that the voltage Vcf of the fourth node ND4 is maintained at the reference value Vr. The (2-2)-th voltage V2-2 and the reference value Vr may be generated to have the waveforms illustrated in FIG. 9.

Although not illustrated, the structure and the operation of the low pass filter of FIG. 17 may also be applied to the embodiments described above.

Figure 18:
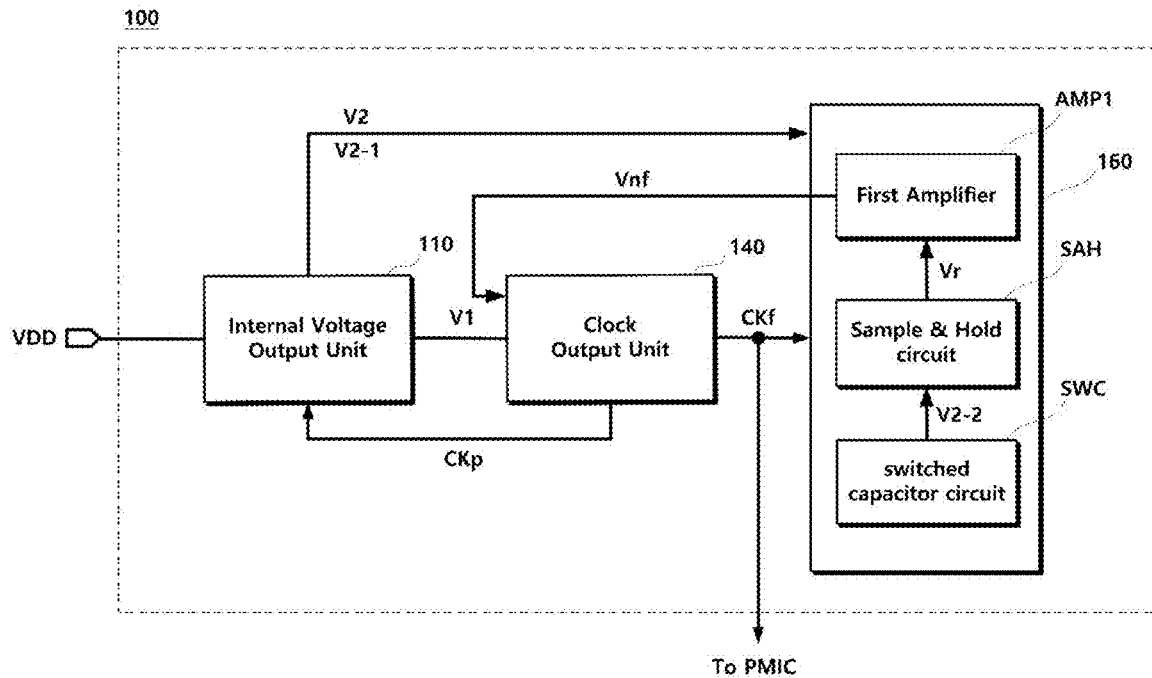
FIGS. 18 and 19 are diagrams illustrating examples of a clock generating device according to various example embodiments.
Figure 19:
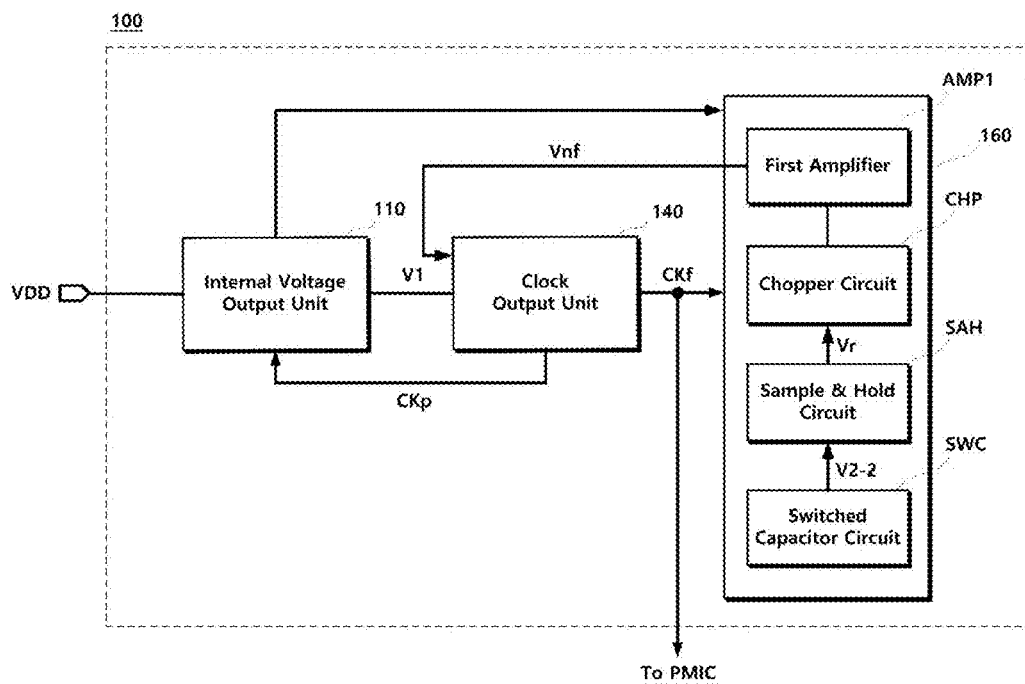

FIGS. 18 and 19 are diagrams illustrating examples of a clock generating device according to various example embodiments.

Referring to FIG. 18, the clock generating device 100 according to various example embodiments may include an internal voltage output unit 110, the clock output unit 140, and the negative feedback voltage generating unit 160.

The internal voltage output unit 110 may generate an internal voltage corresponding to the power supply voltage VDD applied thereto. The power supply voltage VDD may be a battery voltage. The internal voltage may include the first voltage V1 applied to the clock output unit 140 and the second voltage V2 applied to the negative feedback voltage generating unit 160. The first voltage V1 that is a voltage used to generate the final clock signal CKf together with the negative feedback voltage Vnf may be generated in the shape of a triangle wave.

In this case, the internal voltage output unit 110 may generate or output the first voltage V1 and the second voltage V2 such that the sensitivity of the fluctuations in the power supply voltage VDD is maintained identically or similarly. For example, the first voltage V1 and the second voltage V2 may be generated through the same stabilization processing for the fluctuations in the power supply voltage VDD. Alternatively, like FIG. 1, the internal voltage output unit 110 may process the first voltage V1 and the second voltage V2 such that the sensitivity of the fluctuations in the power supply voltage VDD is differently set.

The clock output unit 140 may generate the preliminary clock signal CKp and the final clock signal CKf that have the period corresponding to the difference between the first voltage V1 and the negative feedback voltage Vnf. The clock output unit 140 may provide the preliminary clock signal CKp to the internal voltage output unit 110 and may provide the final clock signal CKf to the negative feedback voltage generating unit 160, and thus, the operation timing of the clock generating device 100 may be controlled. Also, the final clock signal CKf may be provided to the outside of the clock generating device 100, so as to be used to synchronize an operation of an electronic device such as a power management integrated circuit PMIC.

The negative feedback voltage generating unit 160 may generate the negative feedback voltage Vnf corresponding to the second voltage V2 in response to the final clock signal CKf. To this end, the negative feedback voltage generating unit 160 may include a switched capacitor circuit SWC, a sample and hold circuit SAH, and the first amplifier AMP1 connected in series.

The switched capacitor circuit SWC may be switched in response to the final clock signal CKf and may generate the (2-2)-th voltage V2-2 corresponding to the second voltage V2. The sample and hold circuit SAH may sample and hold the reference value Vr from the (2-2)-th voltage V2-2. The first amplifier AMP1 may amplify a difference between the (2-1)-th voltage V2-1 and the (2-2)-th voltage V2-2 and may generate the negative feedback voltage Vnf as an amplification result. The negative feedback voltage Vnf may be applied to the clock output unit 140. The (2-1)-th voltage V2-1 may be generated by the internal voltage output unit 110 as described above. However, the present disclosure is not limited thereto. For example, the (2-1)-th voltage V2-1 may be generated through separate logic.

Referring to FIG. 19, compared to the clock generating device 100 of FIG. 18, the clock generating device 100 of FIG. 19 may further include a chopper circuit CHP that are serially connected with the sample and hold circuit SAH and the first amplifier AMP1. The chopper circuit CHP may cancel an offset of the first amplifier AMP1. As such, the negative feedback voltage Vnf of a uniform voltage level may be generated regardless of the offset of the first amplifier AMP1.

The detailed structures and operations of the switched capacitor circuit SWC, the sample and hold circuit SAH, the first amplifier AMP1, and the chopper circuit CHP of FIGS. 18 and 19 may be the same as those of FIG. 7.

Although not illustrated, the negative feedback voltage generating unit 160 of FIGS. 18 and 19 may be implemented to be the same as the negative feedback voltage generating unit 160 of FIG. 2. Also, the negative feedback voltage generating unit 160 of FIGS. 18 and 19 may be applied to the negative feedback voltage generating unit 160 of FIG. 1.

Figure 20:
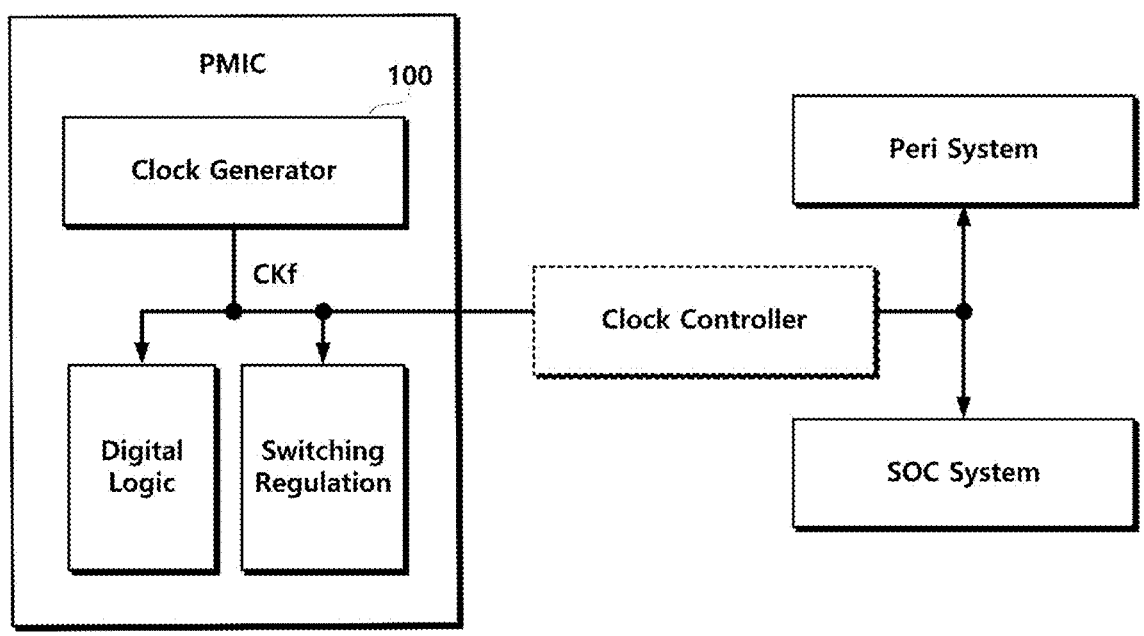
FIG. 20 is a diagram illustrating an electronic device according to various example embodiments.

FIG. 20 is a diagram illustrating an electronic device according to various example embodiments.

Referring to FIG. 20, an electronic device 200 according to various example embodiments may include the clock generating device 100 according to various example embodiments, which is described with reference to FIG. 1. The electronic device 200 according to various example embodiments may be a power management integrated circuit PMIC. The final clock signal CKf that the clock generating device 100 according to various example embodiments generates may be provided to digital logic or a switching regulator included in the power management integrated circuit PMIC. Processing associated with power management may be performed by the digital logic, and a power supply voltage may be converted by the switching regulator so as to have a required voltage level. The digital logic and the switching regulator may perform corresponding operations in synchronization with the final clock signal CKf.

Alternatively, the electronic device 200 according to various example embodiments may be an electronic device that the power management integrated circuit PMIC is included. In this case, the final clock signal CKf that the clock generating device 100 according to various example embodiments included in the power management integrated circuit PMIC generates may be provided to a peripheral system and an SoC system. The peripheral system and the SoC system may receive the final clock signal CKf and may convert and use the final clock signal CKf so as to have a frequency necessary for operation performance. In this case, the final clock signal CKf may be directly provided to the peripheral system and the SoC system. Alternatively, a clock controller included in the electronic device 200 may convert the final clock signal CKf so as to have a frequency corresponding to the peripheral system and the SoC system, and a clock having the converted frequency may be transferred to the peripheral system and the SoC system.

The electronic device 200 according to various example embodiments may include the clock generating device 100 that makes the degree of integration high and generates the final clock signal CKf with high accuracy even in the PVT variations, and thus may perform an operation efficiently and stably. Also, the electronic device 200 according to various example embodiments may include the clock generating device 100 that generates the final clock signal CKf with high accuracy even in the PVT variations while operating at a low power, and thus, the electronic device 200 may reduce power consumption and may operate stably. According to the above description, the electronic device 200 according to various example embodiments may prevent an abnormal operation from occurring even though the electronic device 200 operates at high speed.

As described herein some example embodiments may include various features described as "units" and/or as "circuits". A unit may be or may include a circuit, such as an electrical circuit, and/or may be or may include a processor that is configured to execute machine-readable instructions. A unit and/or a circuit may include one or more electrical components, such as one or more of an active device such as a transistor or a diode and/or an operational amplifier, and/or one or more passive devices such as one or more of a resistor, a capacitor, an inductor, or a memristor, that are arranged and/or are wired to perform various functions, variously described. Alternatively or additionally, a "unit" or a "circuit" may include a processor that is configured to perform one or more functions in response to executing one or more machine-readable instructions.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

According to a clock generator of various example embodiments, a negative feedback loop may be implemented to generate a uniform negative feedback voltage upon generating a clock, and thus, the influence of one or more of process, voltage, and temperature (PVT) variations may be reduced or minimized such that the clock with high accuracy is generated or is more likely to be generated.

Alternatively or additionally, according to the clock generator of various example embodiments, a power supplied to the negative feedback loop may be differently controlled upon generating the clock, and thus, it may be possible to generate the clock with high accuracy even in the change of the power supply voltage and/or to operate at a low power.

Alternatively or additionally, according to the clock generator of various example embodiments, as the negative feedback loop generating the negative feedback voltage includes a switched capacitor circuit and a sample and hold circuit connected in series and controls operation timings thereof, the high integration may be implemented while generating the clock with high accuracy.

Alternatively or additionally, according to the clock generator of various example embodiments, the reliability of operation of a device may be improved by generating the clock with high accuracy.

While various example embodiments have been described, it will be apparent to those of ordinary skill in the art that various changes and modifications may be made thereto without departing from the spirit and scope of the present disclosure as set forth in the following claims. Furthermore example embodiments are not necessarily mutually exclusive. For example, some example embodiments may include one or more features described with reference to one or more figures, and may also include one or more features described with reference to one or more other figures.

What is claimed is:

1. A clock generating device comprising:
   a first voltage output circuit configured to output a first voltage corresponding to a power supply voltage in response to a preliminary clock signal;
   a clock output circuit configured to generate the preliminary clock signal and a final clock signal, the generating of the preliminary clock signal and the final clock signal at a period corresponding to a difference between the first voltage and a negative feedback voltage;
   a negative feedback voltage generating circuit configured to generate the negative feedback voltage from a reference value corresponding to a frequency of the final clock signal and to a second voltage, the reference value filtered to a uniform voltage level; and
   a second voltage output circuit configured to output the second voltage to the negative feedback voltage generating circuit, the second voltage having lower sensitivity of fluctuations in the power supply voltage than the first voltage.

2. The clock generating device of claim 1, wherein the negative feedback voltage generating circuit includes:
   a (2-1)-th voltage generating circuit configured to generate a (2-1)-th voltage corresponding to the second voltage;
   a (2-2)-th voltage generating circuit configured to generate a (2-2)-th voltage for an impedance corresponding to a frequency of the final clock signal, the (2-2)-th voltage corresponding to the second voltage;
   a filtering circuit configured to filter the (2-2)-th voltage to the reference value; and
   an amplifying circuit configured to amplify a difference between the (2-1)-th voltage and the reference value so as to be output as the negative feedback voltage.

3. The clock generating device of claim 2, wherein the negative feedback voltage generating circuit further includes:
   a switching control circuit configured to receive the final clock signal to output a first switching signal.

4. The clock generating device of claim 2, wherein the filtering circuit includes:
   a sample and hold circuit configured to extract the reference value from the (2-2)-th voltage in response to a second switching signal.

5. The clock generating device of claim 1, wherein the negative feedback voltage generating circuit includes:
   a switched capacitor circuit configured to generate a (2-2)-th voltage corresponding to the second voltage in response to the final clock signal;
   a sample and hold circuit configured to extract the reference value from the (2-2)-th voltage applied from the switched capacitor circuit; and
   a first amplifier configured to receive the reference value and a (2-1)-th voltage corresponding to the second voltage and to output the negative feedback voltage.

6. The clock generating device of claim 5, wherein the negative feedback voltage generating circuit further includes:
   a switching control circuit configured to receive the final clock signal to output a first switching signal that controls a switching operation of the switched capacitor circuit and a second switching signal that controls a switching operation of the sample and hold circuit, and
   wherein a transition timing of the first switching signal is different from a transition timing of the second switching signal.

7. The clock generating device of claim 5, wherein the negative feedback voltage generating circuit further includes:
   a first offset canceller circuit configured to cancel an offset of the first amplifier.

8. The clock generating device of claim 7, wherein the clock generating device is configured to operate such that,
   at a first time point of a first period of the (1-1)-th switching signal, the (1-1)-th switching signal transitions to logic high, the (1-2)-th switching signal and the (2-2)-th switching signal are at logic low, and the (2-1)-th switching signal is at logic high,
   at a second time point of the first period of the (1-1)-th switching signal, the (2-1)-th switching signal transitions to logic low, the (1-1)-th switching signal is at logic high, and the (1-2)-th switching signal and the (2-2)-th switching signal is at logic low,
   at a third time point of the first period of the (1-1)-th switching signal, the (1-1)-th switching signal transitions to logic low, the (1-2)-th switching signal, the (2-1)-th switching signal and the (2-2)-th switching signal are at logic low, and
   at a fourth time point of the first period of the (1-1)-th switching signal, the (1-2)-th switching signal transitions to logic high, the (1-1)-th switching signal and the (2-1)-th switching signal are at logic low, and the (2-2)-th switching signal is at logic high.

9. The clock generating device of claim 1, wherein the negative feedback voltage generating circuit includes:
   a first resistor connected between the second voltage and a first node;
   a second resistor connected between the second voltage and a second node and having the same resistance value as the first resistor;
   a reference resistor connected between the first node and a ground node that is configured to connect to a ground voltage;
   a (1-1)-th switch configured to turn on in response to a (1-1)-th switching signal corresponding to the final clock signal and connected between the second voltage and a third node;
   a (1-2)-th switch configured to turn on in response to a (1-2)-th switching signal and connected between the third node and the ground node, an enable period of the (1-2)-th switching signal being different from an enable period of the (1-1)-th switching signal, an enable period of the (1-2)-th switching signal being different from an enable period of the (1-1)-th switching signal;

a switched capacitor connected in parallel with the (1-2)-th switch between the third node and the ground node;

a (2-1)-th switch connected between the second node and a fourth node and configured to turn on in response to a (2-1)-th switching signal, a rising edge and a falling edge of the (2-1)-th switching signal preceding a rising edge and a falling edge of the (1-1)-th switching signal as much as a first time;

a (2-2)-th switch connected between the fourth node and a fifth node and configured to turn on in response to a (2-2)-th switching signal;

a sampling capacitor connected between the fourth node and the ground node; and a first amplifier including a first input terminal receiving the (2-1)-th voltage of the first node, a second input terminal receiving the reference value being the (2-2)-th voltage charged in the sampling capacitor, and an output terminal outputting the negative feedback voltage.

10. The clock generating device of claim 9, wherein the negative feedback voltage generating circuit further includes:

a switching control circuit configured to generate the (1-1)-th switching signal, the (1-2)-th switching signal, the (2-1)-th switching signal, and the (2-2)-th switching signal, wherein an enable period of the (2-2)-th switching signal is different from an enable period of the (2-1)-th switching signal, and the (2-1)-th switching signal is generated to transition with a difference of a first time with the (1-1)-th switching signal.

11. The clock generating device of claim 9, wherein the negative feedback voltage generating circuit further includes:

a chopper circuit connected with a first input terminal and a second input terminal of the first amplifier, and configured to cancel an offset of the first amplifier.

12. The clock generating device of claim 9, wherein the second voltage output circuit includes:

a transistor including a gate configured to receive a voltage of a 21-th voltage node connected with the power supply voltage, a drain, and a source that is connected between the power supply voltage and the second voltage; and a resistor placed between the 21-th voltage node and the ground node.

13. The clock generating device of claim 1, wherein the second voltage output circuit includes:

a second amplifier configured to amplify a difference between a reference voltage, which has a voltage level lower than a voltage level of the power supply voltage and is applied from the outside, and the second voltage that is fed back so as to be output as the second voltage.

14. The clock generating device of claim 13, wherein the second voltage output circuit further includes:

a second offset canceller circuit connected with an input terminal of the second amplifier, and configured to cancel an offset of the second amplifier.

15. The clock generating device of claim 1, wherein the clock output circuit includes:

a comparator configured to receive the first voltage and the negative feedback voltage;

a delay circuit configured to delay an output of the comparator so as to be output as the preliminary clock signal; and a divider circuit configured to divide the preliminary clock signal so as to be output as the final clock signal.

16. An electronic device comprising:

the clock generating device of claim 1; and a power management integrated circuit configured to perform a power management operation in synchronization with the final clock signal received from the clock generating device.

17. A clock generating device comprising:

an internal voltage output circuit configured to output a first voltage and a second voltage in response to a preliminary clock signal, the first voltage and the second voltage respectively correspond to a power supply voltage;

a clock output circuit configured to generate the preliminary clock signal and a final clock signal, the preliminary clock signal and the final clock signal generated at a period corresponding to a difference between the first voltage and a negative feedback voltage; and a negative feedback voltage generating circuit configured to generate the negative feedback voltage corresponding to the second voltage in response to the final clock signal, wherein the negative feedback voltage generating circuit includes:

a switched capacitor circuit connected between an n-th node and a ground node that is configured to connect to a ground voltage, the switched capacitor circuit configured to apply a (2-2)-th voltage corresponding to the second voltage to the n-th node;

a sample and hold circuit serially connected with the switched capacitor circuit at the n-th node, and configured to extract a reference value from the (2-2)-th voltage; and a first amplifier configured to receive the reference value and a (2-1)-th voltage through a first input terminal and a second input terminal respectively, to amplify a difference between the reference value and the (2-1)-th voltage, and to output the negative feedback voltage through an output terminal.

18. The clock generating device of claim 17, wherein the first voltage is different from the second voltage in sensitivity of fluctuations of the power supply voltage.

19. The clock generating device of claim 17, wherein the negative feedback voltage generating circuit further includes:

a chopper circuit configured to cancel an offset of the first amplifier.

20. The clock generating device of claim 17, wherein the internal voltage output circuit is configured to generate the (2-1)-th voltage corresponding to the power supply voltage and outputs the (2-1)-th voltage to the first amplifier.

* * * * *